(12) United States Patent
Vo

(10) Patent No.: US 8,918,374 B1
(45) Date of Patent: Dec. 23, 2014

(54) COMPRESSION OF RELATIONAL TABLE DATA FILES

(75) Inventor: Kiem-Phong Vo, Berkeley Heights, NJ (US)

(73) Assignee: AT&T Intellectual Property I, L.P., Atlanta, GA (US)

(*) Notice: Subject to any disclaimer, the term of this patent is extended or adjusted under 35 U.S.C. 154(b) by 1096 days.

(21) Appl. No.: 12/378,315

(22) Filed: Feb. 13, 2009

(51) Int. Cl.
*G06F 17/00* (2006.01)
*G06F 17/30* (2006.01)
*G06K 9/36* (2006.01)

(52) U.S. Cl.
USPC ........... 707/693; 707/758; 707/796; 707/803; 382/166

(58) Field of Classification Search
CPC ................................. G06F 17/00; G06F 17/30
USPC ......... 707/693, 609, 696–699, 791, 796–797, 707/801–802; 710/65, 68, 70–74; 341/81–87, 50; 711/201–202
See application file for complete search history.

(56) References Cited

U.S. PATENT DOCUMENTS

| | | | | |
|---|---|---|---|---|
| 5,765,158 A * | 6/1998 | Burrows | ................................. | 1/1 |
| 5,951,623 A * | 9/1999 | Reynar et al. | ................. | 708/203 |
| 6,304,676 B1 * | 10/2001 | Mathews | ....................... | 382/246 |
| 6,397,215 B1 * | 5/2002 | Kreulen et al. | ................ | 715/259 |
| 6,502,064 B1 * | 12/2002 | Miyahira et al. | ................... | 704/7 |
| 6,857,047 B2 * | 2/2005 | Basu et al. | ....................... | 711/129 |
| 7,225,211 B1 * | 5/2007 | Colgrove et al. | ............. | 707/693 |
| 7,454,431 B2 * | 11/2008 | Vo et al. | ................................ | 1/1 |
| 7,496,586 B1 * | 2/2009 | Bonwick et al. | ....................... | 1/1 |
| 7,765,346 B2 * | 7/2010 | De Peuter et al. | ............... | 710/68 |
| 8,051,060 B1 * | 11/2011 | Vo et al. | ....................... | 707/705 |
| 8,065,348 B1 * | 11/2011 | Buchsbaum et al. | ......... | 707/812 |
| 8,312,026 B2 * | 11/2012 | Vo | ................... | 707/752 |
| 2002/0040639 A1 * | 4/2002 | Duddleson et al. | ............... | 92/52 |
| 2003/0031246 A1 * | 2/2003 | Heath | ......................... | 375/240 |
| 2003/0061207 A1 * | 3/2003 | Spektor | ............................. | 707/3 |
| 2004/0044659 A1 * | 3/2004 | Judd et al. | .......................... | 707/3 |
| 2005/0155059 A1 * | 7/2005 | Baldwin et al. | ................. | 725/39 |
| 2005/0222997 A1 * | 10/2005 | Peh | ................................. | 707/4 |
| 2006/0212441 A1 * | 9/2006 | Tang et al. | ......................... | 707/5 |
| 2007/0005625 A1 * | 1/2007 | Lekatsas et al. | ............. | 707/101 |
| 2007/0005786 A1 * | 1/2007 | Kumar et al. | ................. | 709/230 |
| 2008/0133562 A1 * | 6/2008 | Cheong et al. | ................ | 707/101 |
| 2008/0162523 A1 * | 7/2008 | Kraus et al. | ..................... | 707/101 |
| 2009/0299973 A1 * | 12/2009 | Kataoka et al. | .................. | 707/3 |
| 2010/0127902 A1 * | 5/2010 | Schneider | ....................... | 341/51 |

* cited by examiner

*Primary Examiner* — Srirama Channavajjala

(57) ABSTRACT

Compression of relational table data is enhanced with a pre-compression step of mapping the values of each field. Illustratively, the data in each cell of the relational table is replaced with a number a smaller number of characters. Additionally side information that is necessary for reversing the mapping is also compressed.

9 Claims, 1 Drawing Sheet

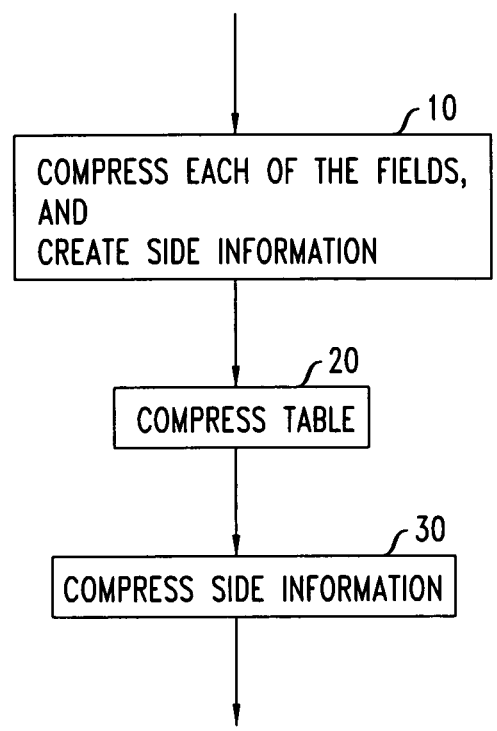

COMPRESSION OF RELATIONAL TABLE DATA FILES

BACKGROUND OF THE INVENTION

This relates to data compression.

Modern information systems routinely generate and store massive amounts of data in data warehouses to manage ongoing operations. Data are often produced and stored in a common format called the "relational table". Each such table consists of a set, or a sequence, of records, and each contains fields that store data values. It is not unusual for a relational table to have several millions of records with each record containing thousands of bytes. As a result, many terabytes of data are often kept on-line at a storage cost that is measured in the tens to hundreds of millions of dollars. On top of that, large transmission costs are frequently incurred in electronically transporting data between systems. Thus, good compression of relational tables can have significant financial impact on the management and operation of these large information systems.

The internal structure of a relational table varies depending on specific needs. In some cases, a data file may be kept in textual form with records being text lines and fields being strings separated by some field delimiter. In other cases, a record may consist of fields that have a fixed length; i.e., a fixed number of bytes. Yet, other types of record might have variable representations with some extra encoded data to tell which representation is which.

Certain data come in a "flat table" form which consists of a two-dimensional array of bytes with known numbers of columns and rows. A relational table whose records all have the same length can be thought of as a flat table if we ignore the field structure within records and treat each record as a row.

In "Engineering the Compression of Massive Tables: An Experimental Approach," *Proc. 11th ACM-SIAM Symp. on Disc. Alg.*, pp. 175-184, 2000, Buchsbaum et al considered the problem of compressing flat tables, and have developed what they called the Pzip algorithm. This algorithm assumes some external conventional compressor as a basic primitive and defines the compressive entropy of a data set as the size after being compressed by this compressor. Then, columns are grouped to improve overall compressive entropy when compressed in groups. Since computing an optimum column grouping is NP-hard, a two-step solution is employed. Columns are first reordered by a traveling salesman tour that keeps pairs compressed well together close in the ordering. Then, the ordered columns are segmented by a dynamic program to reduce overall compressive entropy. If n is the number of columns, the dynamic program alone would require $O(n^3)$ steps, each compressing some segment of columns.

The process of column grouping in Pzip can be quite slow, sometimes taking hours for tables with just a few hundred columns. Therefore, per class of tables, Pzip typically first restricts itself to a small amount of training data to do column grouping, and then uses the results for all tables in the class. This approach works fine as long as table characteristics are consistent, but poor compression performance can result when they are not.

Columns in a flat table may be dependent on one another in the sense that the content of a column may be closely predictable by that of another column or a group of other columns. Predictability among columns implies information redundancy which could be exploited to enhance compression. In a paper title "Compressing Table Data with Column Dependency", *Theoretical Computer Science*, vol. 387, Issue 3, pp. 273-283 (November 1007), Binh Dao Vo and Kiem Phong Vo formalize the notion of column dependency as a way to capture this information redundancy across columns and discuss how to automatically compute and use it to substantially improve table compression.

The problem of compressing relational tables has been studied in the literature. A white paper "Oracle Advanced Compression" by the Oracle company describe a method to construct a dictionary of unique field values in a relational table, then replace each occurrence of a value by its dictionary index. Since field values can be long, removing duplication in this way does reduce the amount of storage space required. In a different paper, "How to Wring a Table Dry: Entropy Compression of relations and Querying of Compressed Relations" (Very Large DataBase Conference, 2006), V. Raman and G. Swart discusses how to take advantage of the skew distribution of values in a field, correlation across fields within a record, and the unordered nature of records in a database to compress data. By treating records as being unordered, this method does not preserve the given order of records in a file. Hence, the method is not lossless.

There remains a need for a compression method for relational tables in a manner that is both lossless and effective.

SUMMARY OF THE INVENTION

An advance in the art is achieved by mapping the set of values in each of the fields into smaller table, and compressing the smaller table by any suitable compression technique. The sets of field values along with their mappings are also compressed by any suitable compression technique to form side information. The two compression steps may use different compression techniques. The mapping of the field values to form the smaller table may be chosen to yield fixed length strings that result in a flat table, enabling the use of well known and effective flat table compression techniques. Further, the mapping may be chosen to be implicit. For example, the values of a given field may be mapped to a contiguous set of integers, e.g., 0, 1, . . . , K−1, where K is the number of unique values. This makes the mapping implicit in the order of the unique field values in an output list of the field values, thereby reducing the side information because only that output list needs to be compressed.

BRIEF DESCRIPTION OF THE DRAWING

FIG. 1 presents a block diagram of a method in accord with the principles of this invention.

DETAILED DESCRIPTION

The set of values of a field in a relational table tends to be far smaller than the maximum possible number of values for that field because the values are often restricted by factors driving the generation of the table. This is inherently true for fields that are not restricted to a fixed length, and it is also generally true for table fields that have a fixed length. In the case of a 5-digit fixed field, for example, it is clear that it can contain up to $10^5$ different values, but when that field is assigned to hold zip codes, it most likely will contain significantly fewer unique values. For instance, all northern New Jersey zip codes have 07 as the first two digits (due to the allocation of zip codes by location) and, consequently, the set of zip codes in a personnel database table of an employer in northern New Jersey would most likely contain orders of magnitude fewer unique values than the aforementioned maximum $10^5$ number. Further, the same set of zip codes might be further clustered into groups with larger groups closer to where the employer is located.

Different fields in a relational table may also be correlated. For example, like zip codes, telephone numbers are also allocated based on location. So, a field storing zip codes and a field storing area codes would often correspond well. This type of relationship between fields is similar to the notion of functional dependency in general relational databases, but it does not always have to be perfect. For example, an area code might correspond with more than one zip code and vice versa. From the point of view of data compression any such correlation represents, as indicated above, redundant information and could be exploited to reduce data encoding.

FIG. 1 presents a flowchart of the method in accord with the principles of this invention. Step 10 independently maps each of the fields of the relational table to be compressed. The mapping, in it most general sense, is simply an undertaking to map each entry to a short form and to thereby reduce the total number of characters in the field. Illustratively, if the field specifies countries, the action may be one that maps "United States of America" to "United States" or to "USA" or to "US". Obviously, the mapping to "US" results in fewest characters. Such mapping is lossless, which means that it is reversible. In some instances it is acceptable, and perhaps even desirable, to have some nominal loss, such as when a number of strings really mean the same thing. For example, the action in step 10 might be to map all entries of the form "United States of America," "United States," or "USA" to "US." Aside from reducing the number of characters (from 24, 13, or 3) to 2, use of such a rule reduces the number of unique entries in the field. The mappings for the different fields need not be the same, of course; and even if a common algorithmic mapping is employed, it does not mean that the actual mappings are the same across fields.

Once a mapping to short form entries is carried out, the subject table can be represented in two parts; the first being the table where all entries in each field have their mapped (short) form, herein referred to as the reduced table, and the second being side information (which effectively is a dictionary) that provides information for reverse mapping of the short form entries. The dictionary entries can, for example, form a sequence of fields separated by a delimiter (or two different delimiters), such as United States of America:USA#Great Britain: Eng#Dominican Republic:Dom# . . . .

While the mappings to short form do not have to be restricted in any way, it may be advantageous to employ mappings that result in fixed-length entries. The necessary length of such fixed-length mapping has, of course, a lower bound that is dictated by the number of unique field values. For example, if one wishes to operate in binary, one can specify K unique field values by using $\lceil \log_2 K \rceil$ bits (illustratively, if K=28, a field of 5 bits can be used), or $\lceil \log_{256} K \rceil$ bytes, or $\lceil \log_{10} K \rceil$ digits.

A particularly advantageous mapping is an algorithmic mapping that requires no explicit mapping dictionary. Illustratively, the algorithm begins to map the entries of a field by setting variable j to 0. Going through the field entries, when a word is encountered for the first time the algorithm replaces that word with j, increments j, appends that word to a side information list, and continues, until the entire field is mapped. With such an algorithm there is no need for an explicit specification of the mapping because it is embedded in the order of the side information list. It may be noted that mapping to integers (j) does not ipso facto create fixed length fields. Fixed length fields can be obtained by including leading zeros (such as 001, 027, 129, etc.). It may be noted also that while the number of characters that are limited to digits needs to be at least $\lceil \log_{10} K \rceil$, a greater number can be used.

In Step 20, the reduced table is compressed using whatever algorithm is desired.

The algorithm that is believed to be currently best suited for this purpose is the one identified above, by Binh Dao Vo and Kiem Phong Vo (the inventor herein). To assist the reader, the above identified article is enclosed herein as an appendix.

Step 30 (which in FIG. 1 follows step 20, but it could precede step 20) compresses the side information, which is the set of unique field values and the mappings (if appropriate). Since the field values can be an arbitrary sequence of bytes, the compression algorithm for the side information can be any well-known general-purpose compression algorithm, such as Lempel-Ziv-1977 or Huffman, etc.

The invention claimed is:

1. A method for compressing a relational data file having a plurality of records and a plurality of fields, where each of the plurality of records has a character string associated with each of the plurality of fields, comprising:

creating a reduced table by mapping the character string of each one of the plurality of fields of the relational data file to replace the character string in the each one of the plurality of fields with a replacement character string of a length that is shorter than a length of the character string in the each one of the plurality of fields, wherein the replacement character string comprises an abbreviation that represents different character strings in different ones of the plurality of fields of the relational data file;

forming side information in course of the mapping from which character strings that are replaced are recoverable, wherein the side information includes a sequence of character strings taken from the character strings found in one of the plurality of fields that is mapped, a delimiter character and the replacement character string;

applying a first compression process to the reduced table having the replacement character string in each one of the plurality of fields after the mapping; and applying a second compression process to the side information.

2. The method of claim 1, wherein the side information is such that all of the replaced character strings are recoverable.

3. The method of claim 1, wherein the side information is such that one of the character strings that is replaced cannot be recovered precisely.

4. The method of claim 1, wherein, for each one of the plurality of fields that is mapped, the mapping maps each of the character strings to a string of a length specified for the one of the plurality of fields that is mapped.

5. The method of claim 1, wherein, for each one of the plurality of fields that is mapped, the mapping maps each of the character strings to an integer.

6. The method of claim 5, wherein a number of digit characters of the integer is at least $[\log_{10} K]$, where K is a number of unique values of the one of the plurality of fields.

7. The method of claim 5, wherein, for each one of the plurality of fields that is mapped, the side information comprises a sequence of character strings taken from the character strings found in the one of the plurality of fields that is mapped, and the integer is implicit.

8. The method of claim 1, wherein the first compression process uses correlations between fields of the reduced table.

9. The method of claim 1 where the second compression process is different from the first compression process.

* * * * *